United States Patent
Lin et al.

(10) Patent No.: US 10,141,378 B2
(45) Date of Patent: Nov. 27, 2018

(54) LIGHT EMITTING DEVICE FREE OF TFT AND CHIPLET

(71) Applicant: Industrial Technology Research Institute, Hsinchu (TW)

(72) Inventors: Yi-Ping Lin, Hsinchu (TW); Jung-Yu Li, Hsinchu (TW); Guan-Yu Chen, Hsinchu (TW); Jin-Han Wu, Hsinchu (TW); Cheng-Hung Li, Hsinchu (TW); Shih-Pu Chen, Hsinchu (TW)

(73) Assignee: INDUSTRIAL TECHNOLOGY RESEARCH INSTITUTE, Hsinchu (TW)

(*) Notice: Subject to any disclaimer, the term of this patent is extended or adjusted under 35 U.S.C. 154(b) by 321 days.

(21) Appl. No.: 14/475,083

(22) Filed: Sep. 2, 2014

(65) Prior Publication Data

US 2015/0115249 A1     Apr. 30, 2015

Related U.S. Application Data

(63) Continuation-in-part of application No. 14/137,764, filed on Dec. 20, 2013, now abandoned.

(30) Foreign Application Priority Data

Oct. 30, 2013  (TW) .............................. 102139269 A
May 7, 2014   (TW) .............................. 103116203 A (51) Int. Cl.
   *H01L 27/32*    (2006.01)
   *H01L 51/52*    (2006.01)

(52) U.S. Cl.
   CPC ...... *H01L 27/3211* (2013.01); *H01L 27/3237* (2013.01); *H01L 27/3239* (2013.01);
   (Continued)

(58) Field of Classification Search
   CPC . H01L 27/32; H01L 27/3206; H01L 27/3239; H01L 51/5088; H01L 51/5092; H01L 29/04
   (Continued)

(56) References Cited

U.S. PATENT DOCUMENTS 5,805,136 A    9/1998  Silverbrook et al.
6,320,322 B1  11/2001  Tanaka
(Continued)

FOREIGN PATENT DOCUMENTS

TW    538398 B    6/2003
TW    I381542     1/2013

OTHER PUBLICATIONS

T.K. Wee et al., "Adaptive Display Power Management for OLED Displays," MobiGames 12, Aug. 13, 2012, Finland, pp. 25-30.
(Continued)

*Primary Examiner* — Thao P Le
(74) *Attorney, Agent, or Firm* — Muncy, Geissler, Olds & Lowe, P.C.

(57) ABSTRACT

A light emitting device is disclosed, including a first electrode layer, a second electrode layer, and an organic light emitting layer sandwiched between the first and second electrode layers. The second electrode layer is patterned to form a plurality of electrode patterns arranged with different densities. The organic light emitting layer is subjected to a color separation process to form a plurality of monochromatic blocks that correspond to the electrode patterns, respectively. The electrode patterns are divided into a plurality of electrode pattern groups arranged in an alternate manner. The electrode pattern groups display a same image, and a same voltage is applied to the electrode pattern groups at a same time. Alternatively, the electrode pattern groups display different images, and a same or different voltages are
(Continued)

applied to the electrode pattern groups at different times. As such, the light emitting device generates grayscale, full-color, three-dimensional or dynamic images.

7 Claims, 14 Drawing Sheets

(52) U.S. Cl.
CPC ...... *H01L 51/5209* (2013.01); *H01L 51/5225* (2013.01); *H01L 2251/5361* (2013.01)

(58) Field of Classification Search
USPC ........ 345/76, 77; 313/504, 506; 257/100, 59
See application file for complete search history.

(56) References Cited

U.S. PATENT DOCUMENTS

| | | | |
|---|---|---|---|
| 6,692,845 B2* | 2/2004 | Maruyama | H01L 51/5092 257/100 |
| 6,872,472 B2 | 3/2005 | Liao et al. | |
| 7,227,305 B2 | 6/2007 | Liu et al. | |
| 7,342,249 B2* | 3/2008 | Park | H01L 27/322 257/59 |
| 7,365,486 B2* | 4/2008 | Lee | B82Y 10/00 313/504 |
| 7,492,337 B2* | 2/2009 | Fukase | H01L 27/3216 345/76 |
| 7,733,014 B2 | 6/2010 | Iou | |
| 7,825,584 B2 | 11/2010 | Kim | |
| 2004/0227703 A1 | 11/2004 | Lamvik et al. | |
| 2007/0040496 A1* | 2/2007 | Yu | H01L 27/3239 313/506 |
| 2010/0264816 A1* | 10/2010 | Cok | H01L 27/3255 313/506 |
| 2011/0095996 A1* | 4/2011 | Yilmaz | G06F 3/044 345/173 |
| 2011/0180836 A1 | 7/2011 | Son | |
| 2011/0279429 A1* | 11/2011 | Kim | G09G 3/3674 345/211 |
| 2014/0146261 A1* | 5/2014 | Wu | G02F 1/134309 349/43 |
| 2015/0115249 A1* | 4/2015 | Lin | H01L 51/5209 257/40 |

OTHER PUBLICATIONS

D. Shin et al., "Dynamic Voltage Scaling of OLED Displays," Design Automation Conference (DAC) 11, Jun. 5-10, 2011, CA, pp. 53-58.

K. Hori et al., "Development and Mass-Production of an OLED Lighting Panel—Most-Promising Next-Generation Lighting—" Mitsubishi Heavy Industries Technical Review, vol. 49, No. 1, Mar. 2012, pp. 47-53.

G. Yang et al., "1.8-in. 128×160 Full Color Passive Matrix OLED," Proc. of SPIE, vol. 6722 (2007), Downloaded From: http://proceedings.spiedigitallibrary.org/ on Jul. 25, 2013 Terms of Use: http://spiedl.org/terms.

P.K. Uttwani et al., "Detection of Physical Defects in Full Color Passive-Matrix OLED Display by Image Driving Techniques," Journal of Display Technology, vol. 8, No. 3, Mar. 2012, pp. 154-161.

J. Quan et al., "Design of passive matrix organic light-emitting diodes," Proceedings of SPIE vol. 5519 (2004), pp. 242-249, Downloaded From: http://proceedings.spiedigitallibrary.org/ on Dec. 16, 2013 Terms of Use: http://spiedl.org/terms.

A. Nathan et al., "Amorphous Silicon Thin Film Transistor Circuit Integration for Organic LED Displays on Glass and Plastic," IEEE Journal of Solid-State Circuits, vol. 39, No. 9, Sep. 2004, pp. 1477-1486.

Y-C Liu et al., "New flat electron emission light source with transparency and heat insulation properties," Journal of Illuminating Engineer, vol. 28, No. 4; Nov. 2011, pp. 1-6.

R-G Seong et al., Flexible AMOLED Backplane Technology Using Pentacene TFTs, Proc. Int. Symp. Super-Functionality Organic Devices, IPAP Conf. Series 6, Jan. 2005, pp. 146-149.

* cited by examiner

LIGHT EMITTING DEVICE FREE OF TFT AND CHIPLET

CROSS-REFERENCE TO RELATED APPLICATIONS

This application is a continuation-in-part of U.S. Ser. No. 14/137,764, filed on Dec. 20, 2013, and claims priority to Taiwanese Application Serial No. 102139269, filed on Oct. 30, 2013, and to Taiwanese Application Serial No. 103116203, filed on May 7, 2014. The entirety of the above-mentioned patent applications is hereby incorporated by reference herein and made a part of this specification.

BACKGROUND

1. Technical Field

The present disclosure relates to light emitting devices, and, more particularly, to an organic light emitting device that generates grayscale, full-color, three-dimensional and dynamic images.

2. Description of Related Art

Organic light emitting diodes (OLED) are regarded as the most promising light sources in the future. Compared with a conventional fluorescent lamp or a solid state light source such as a light emitting diode, an OLED has a light weight and a high color rendering index, generates low glare light, and is flexible and transparent. Therefore, the application of the OLEDs on illumination can be much diversified.

Currently, full-color images can be generated by passive matrix OLEDs (PMOLEDs) that control upper and lower electrodes of each pixel, or generated by active matrix OLEDs (AMOLEDs) that control brightness of each pixel through a thin film transistor (TFT).

However, to control the luminous intensity of each pixel so as to generate full-color/grayscale images, the voltage applied to each pixel needs to be controlled through a thin film transistor, thus complicating the process. Further, TFT driving control circuits are costly and hinder the development of low-cost organic light emitting devices.

Therefore, how to overcome the above-described drawbacks has become urgent.

SUMMARY

In view of the above-described drawbacks, the present disclosure provides a light emitting device, which comprises: a first electrode layer; an organic light emitting layer formed on the first electrode layer; and a second electrode layer formed on the organic light emitting layer, wherein the organic light emitting layer is sandwiched between the first electrode layer and the second electrode layer, and the second electrode layer is patterned to form a plurality of electrode patterns arranged with different densities. A voltage can be applied between the first electrode layer and the second electrode layer so as for the light emitting device to generate a grayscale image.

Further, the organic light emitting layer can be subjected to a color separation process to form a plurality of monochromatic blocks that correspond to the electrode patterns, respectively. As such, a voltage can be applied between the first electrode layer and the second electrode layer so as for the light emitting device to generate a full-color/grayscale image.

The present disclosure provides another light emitting device, which comprises: a first electrode layer; an organic light emitting layer formed on the first electrode layer; and a second electrode layer formed on the organic light emitting layer, wherein the organic light emitting layer is sandwiched between the first electrode layer and the second electrode layer, the second electrode layer is patterned to form a plurality of electrode patterns arranged with different densities, and the electrode patterns are divided into a plurality of electrode pattern groups that are arranged in an alternate manner.

In an embodiment, the electrode pattern groups display a same image, and a same voltage is applied to the electrode pattern groups at a same time. As such, the light emitting device generates a three-dimensional image.

In another embodiment, the electrode pattern groups display different images, and a same or different voltages are applied to the electrode pattern groups at different times. As such, the light emitting device generates a dynamic image.

The present disclosure provides yet another light emitting device, which comprises: a first electrode layer; a first organic light emitting layer formed on the first electrode layer; a second organic light emitting layer formed on the first organic light emitting layer; and a second electrode layer formed on the second organic light emitting layer, wherein the first organic light emitting layer is sandwiched between the first electrode layer and the second organic light emitting layer, the second organic light emitting layer is sandwiched between the second electrode layer and the first organic light emitting layer, and the second electrode layer is patterned to form a plurality of electrode patterns arranged with different densities.

In an embodiment, an electric charge generating layer is formed between the first organic light emitting layer and the second organic light emitting layer, and a voltage is applied between the first electrode layer and the second electrode layer. As such, the light emitting device generates a three-dimensional image.

In another embodiment, the light emitting device further comprises a third electrode layer, an insulating layer and a fourth electrode layer that are sequentially stacked between the first organic light emitting layer and the second organic light emitting layer, wherein the third electrode layer is patterned to form a plurality of electrode patterns arranged with different densities, the electrode patterns of the second electrode layer display an image that is different from an image displayed by the electrode patterns of the third electrode layer, and a same or different voltages are applied to the second electrode layer and the third electrode layer at different times. As such, the light emitting device generates a dynamic image.

According to the present disclosure, the second electrode layer, which is an anode electrode layer or a cathode electrode layer, is patterned to form a plurality of electrode patterns arranged with different densities. For example, the electrode patterns have different sizes or pitches, or each pixel has a different number of electrode patterns. As such, when a voltage is applied between the first electrode layer and the second electrode layer, the light emitting device according to the present disclosure generates a grayscale image. Further, by performing a color separation process on the organic light emitting layer to form a plurality of monochromatic blocks, the light emitting device generates a full-color/grayscale image. Furthermore, by arranging the electrode patterns in a vertical direction or a horizontal direction and applying voltages of suitable values and time sequences on the electrode layers, the light emitting device according to the present disclosure can generate a three-dimensional or dynamic image in full color/grayscale. Therefore, the present disclosure eliminates the need to control the brightness of each pixel through a thin film transistor as in the prior art.

DETAILED DESCRIPTION

In the following detailed description, for purposes of explanation, numerous specific details are set forth in order to provide a through understanding of the disclosed embodiments. It will be apparent, however, that one or more embodiments may be practiced without these specific details. In other instances, well-known structures and devices are schematically shown in order to simplify the drawing.

Figure 1A:
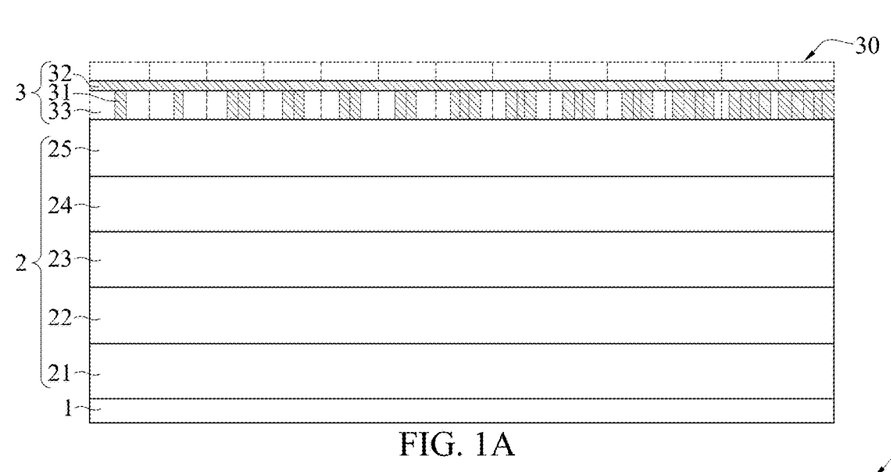
FIG. 1A is a schematic cross-sectional view of a light emitting device according to a first embodiment of the present disclosure.
Figure 1B:
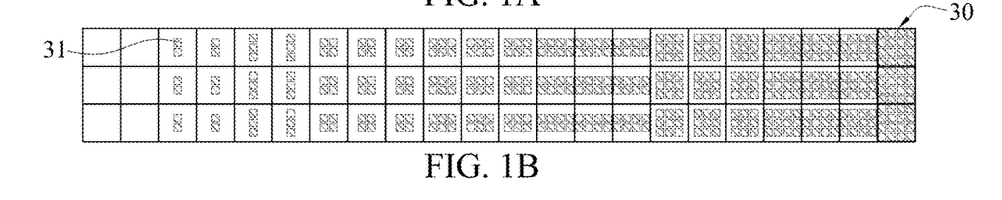
FIG. 1B is a schematic upper view of the light emitting device according to the first embodiment of the present disclosure.

FIGS. 1A and 1B are schematic cross-sectional and upper view of a light emitting device according to a first embodiment of the present disclosure, respectively. Referring to FIG. 1A, the light emitting device has a first electrode layer 1, an organic light emitting layer 2, and a second electrode layer 3 sequentially stacked on one another.

The first electrode layer 1 is an anode electrode layer. The first electrode layer 1 is, but not limited to, a transparent electrode layer, and is made of ITO, IZO or any other transparent conductor material.

The organic light emitting layer 2 is formed on the first electrode layer 1 and has a hole injection layer (HIL) 21, a hole transport layer (HTL) 22, an emitting layer (EML) 23, an electron transport layer (ETL) 24, and an electron injection layer (EIL) 25.

The second electrode layer 3 is formed on the organic light emitting layer 2, and the organic light emitting layer 2 is sandwiched between the first electrode layer 1 and the second electrode layer 3. The second electrode layer 3 is a cathode electrode layer. The second electrode layer 3 is, but not limited to, a reflective electrode layer, and is made of metal. In another embodiment, both the first electrode layer 1 and the second electrode layer 3 are transparent electrode layers.

When a voltage is applied between the first electrode layer 1 and the second electrode layer 3, holes from the first electrode layer 1 are injected through the hole injection layer 21 to the hole transport layer 22 and transported through the hole transport layer 22 to the emitting layer 23, and electrons from the second electrode layer 3 are injected through the electron injection layer 25 to the electron transport layer 24 and transported through the electron transport layer 24 to the emitting layer 23. When the holes and the electrons are recombined in the emitting layer 23, light is generated.

The second electrode layer 3 is patterned to form a plurality of electrode patterns 31 arranged with different densities, which is detailed as follows.

Figure 1C:
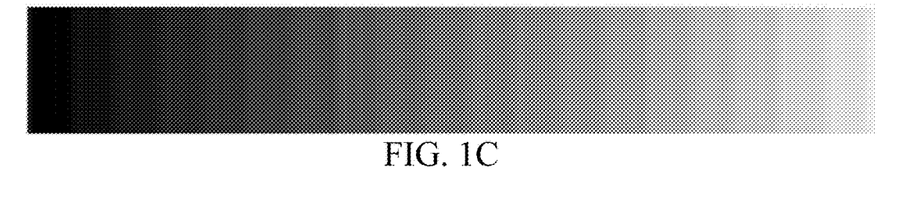
FIG. 1C shows a grayscale image generated by the light emitting device according to the first embodiment of the present disclosure.

Referring to FIGS. 1A and 1B, the second electrode layer 3 is divided into a plurality of pixels 30 each having a different number of the electrode patterns 31. Some of the electrode patterns 31 are connected through planar electrodes 32, and the others are separated by an insulating material 33. In the first embodiment, the electrode patterns 31 have a same size but different pitches. The "pitch" is referred to a distance between the centers of two adjacent electrode patterns. FIG. 1C shows a grayscale image generated by the light emitting device according to the first embodiment of the present disclosure.

Figure 2A:
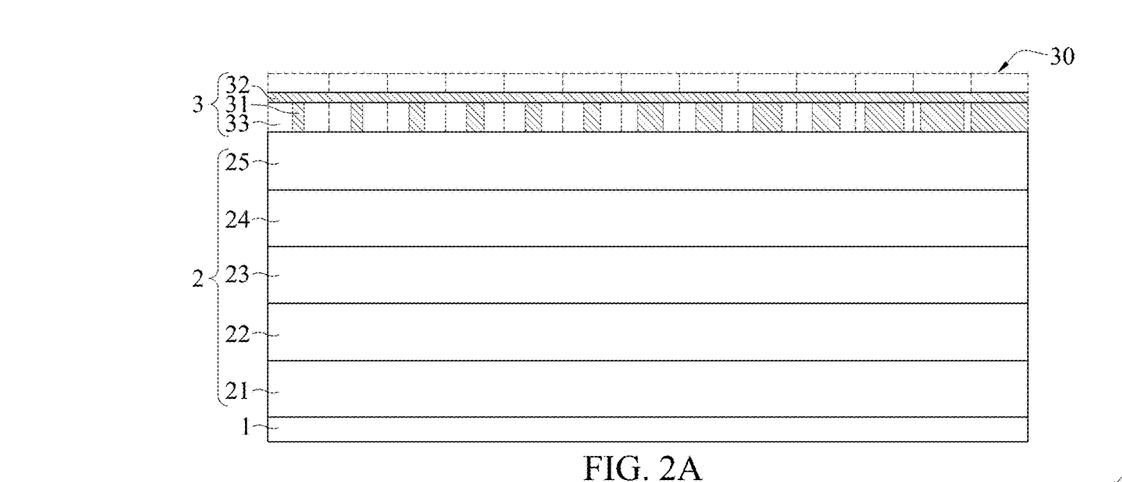
FIG. 2A is a schematic cross-sectional view of a light emitting device according to a second embodiment of the present disclosure.
Figure 2B:
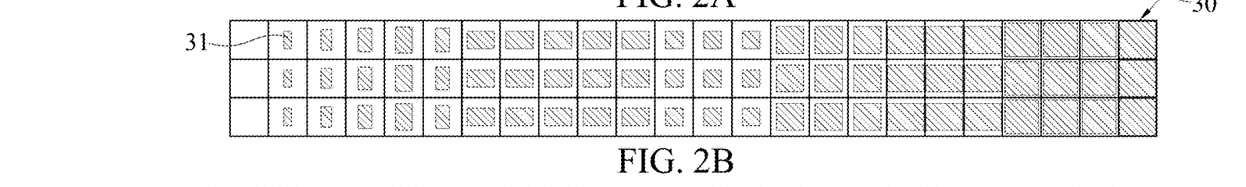
FIG. 2B is a schematic upper view of the light emitting device according to the second embodiment of the present disclosure.
Figure 2C:
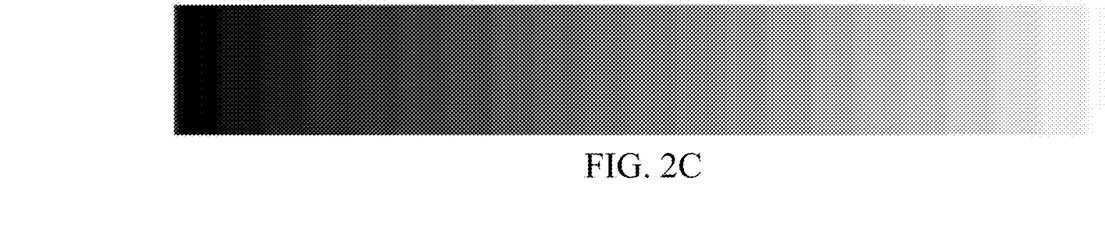
FIG. 2C shows a grayscale image generated by the light emitting device according to the second embodiment of the present disclosure.

FIGS. 2A and 2B are schematic cross-sectional and upper view of a light emitting device according to a second embodiment of the present disclosure, respectively. Referring to FIGS. 2A and 2B, the second embodiment differs from the first embodiment in that the second electrode layer 3 of the light emitting device of the second embodiment is divided into a plurality of pixels 30 each having a same number of the electrode patterns 31. Some of the electrode patterns 31 are connected through the planar electrodes 32, and the others are separated by the insulating material 33. In the second embodiment, the electrode patterns 31 have different sizes but a same pitch. FIG. 2C shows a grayscale image generated by the light emitting device according to the second embodiment of the present disclosure.

According to the first and second embodiments, by arranging the electrode patterns 31 of the second electrode layer 3 with different densities, including changing the sizes or pitches of the electrode patterns or the number of the electrode patterns of each pixel, each pixel 30 has a different light emitting area. The larger the light emitting area, the higher the visual brightness becomes. As such, the light emitting device can be controlled to generate a grayscale image.

Figure 3A:
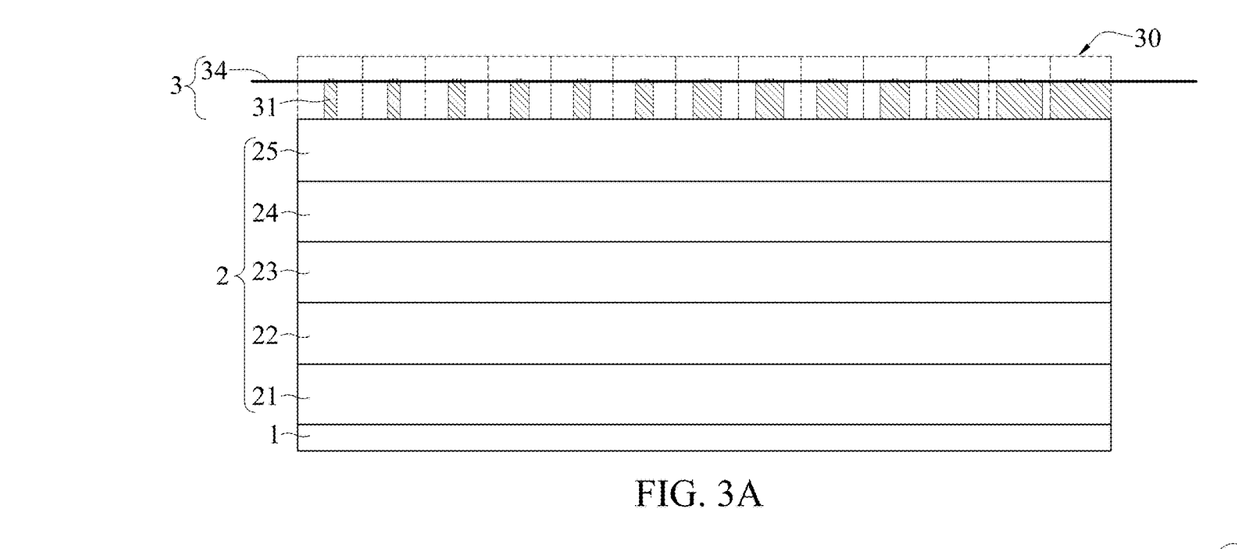
FIG. 3A is a schematic cross-sectional view of a light emitting device according to a third embodiment of the present disclosure.
Figure 3B:
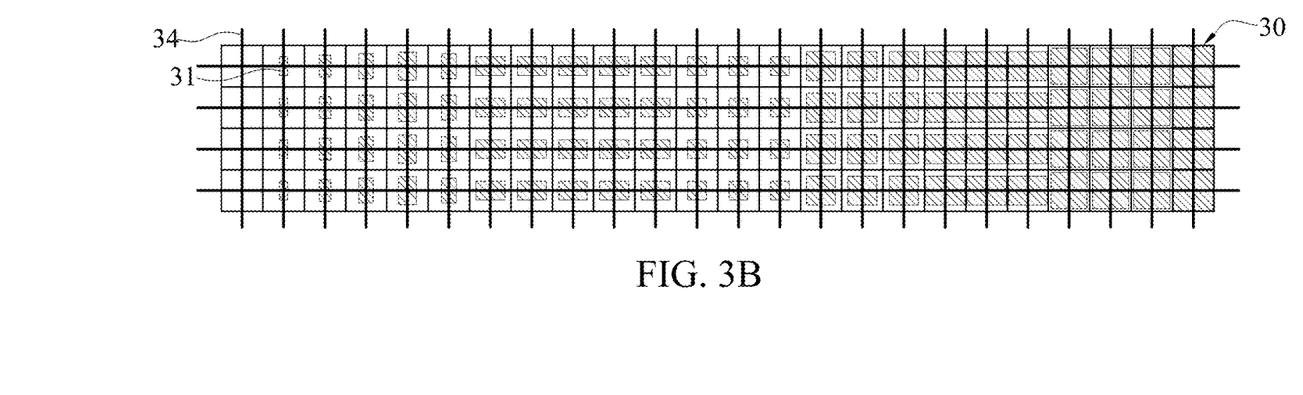
FIG. 3B is a schematic upper view of the light emitting device according to the third embodiment of the present disclosure.

FIGS. 3A and 3B are schematic cross-sectional and upper view of a light emitting device according to a third embodiment of the present disclosure, respectively. The third embodiment differs from the first and second embodiments in that the electrode patterns 31 of the light emitting device of the third embodiment are connected through conductive lines 34 that are, for example, in a mesh pattern, and no insulating material is filled between any two of the electrode patterns 31.

Figure 1D:
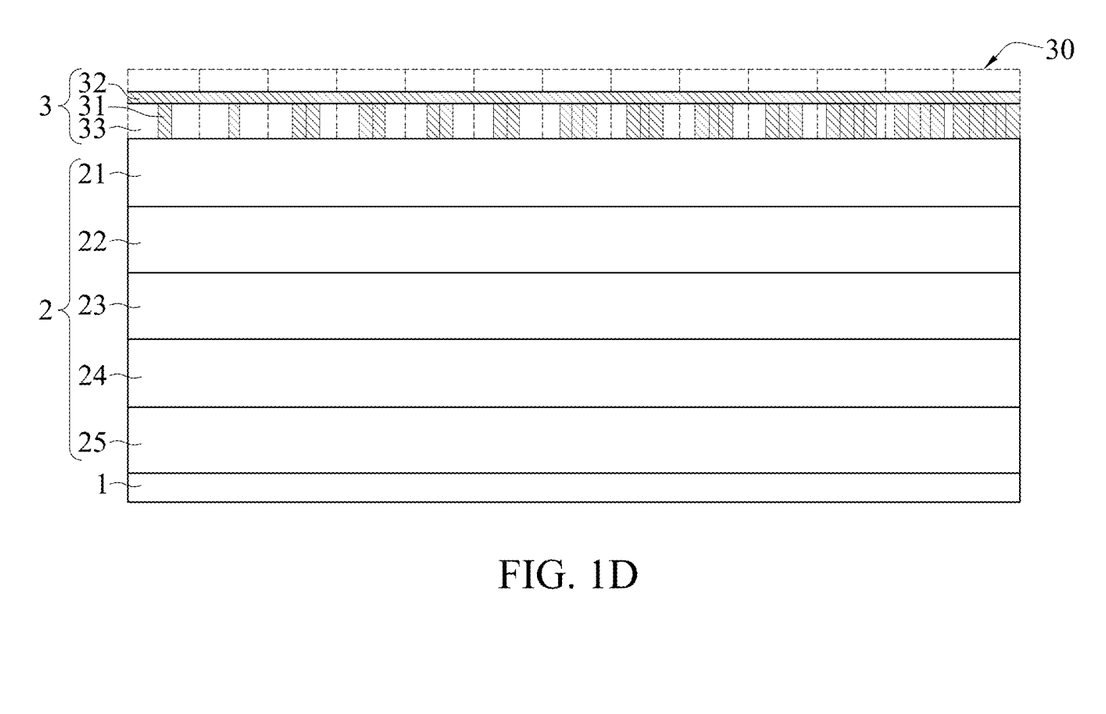
FIG. 1D is a schematic cross-sectional view showing another example of the light emitting device according to the first embodiment of the present disclosure.
Figure 2D:
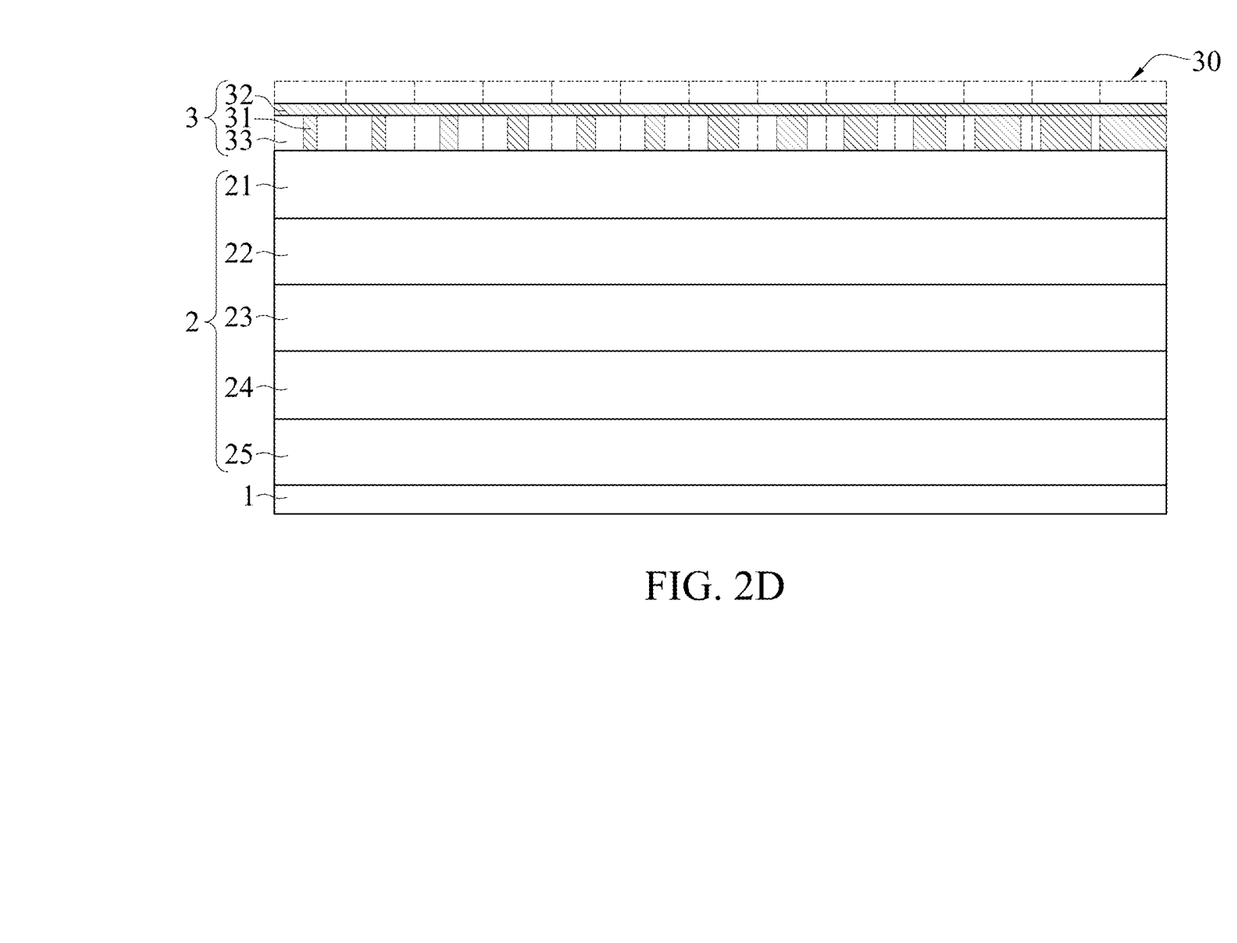
FIG. 2D is a schematic cross-sectional view showing another example of the light emitting device according to the second embodiment of the present disclosure.
Figure 3C:
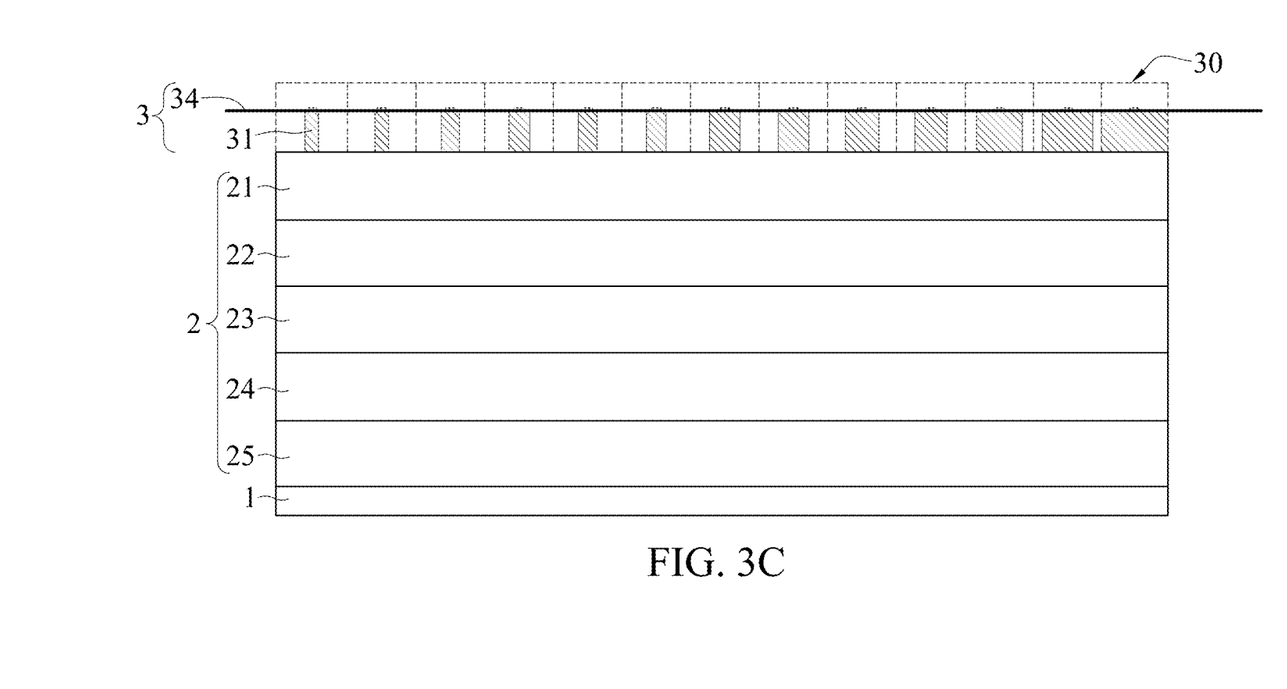
FIG. 3C is a schematic cross-sectional view showing another example of the light emitting device according to the third embodiment of the present disclosure.

Further, referring to FIGS. 1D, 2D and 3C, in another example, the first electrode layer 1 is a cathode electrode layer, and the second electrode layer 3 is an anode electrode layer.

Figure 4A:
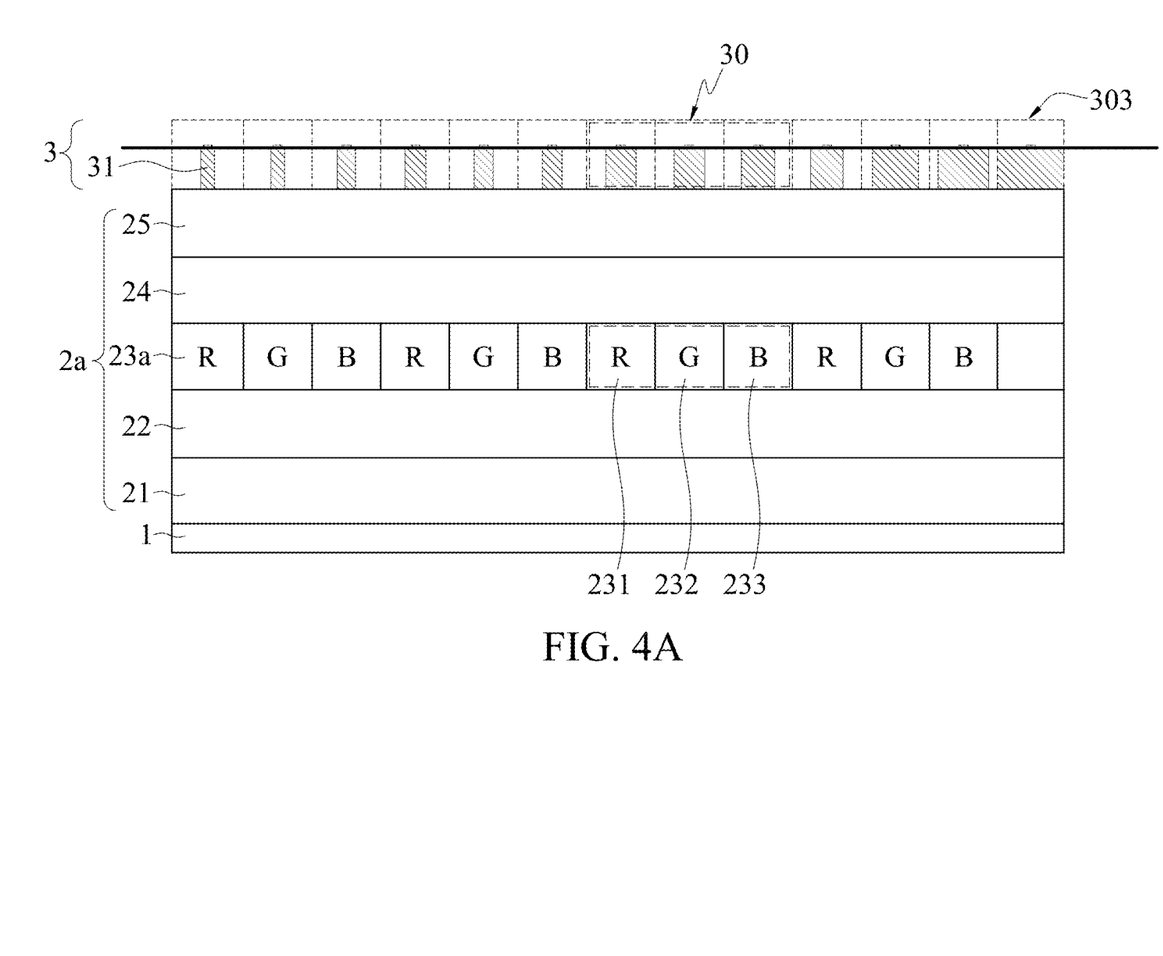
FIG. 4A is a schematic cross-sectional view of a light emitting device according to a fourth embodiment of the present disclosure.

FIG. 4A is a schematic cross-sectional view of a light emitting device according to a fourth embodiment of the present disclosure. Referring to FIG. 4A, the emitting layer 23a of the organic light emitting layer 2a is subjected to a color separation process to form a plurality of monochromatic blocks 231, 232 and 233, i.e., red blocks (R), green blocks (G) and blue blocks (B) corresponding to the pixels 30.

The electrode patterns 31 of the second electrode layer 3 correspond to the monochromatic blocks 231, 232, 233, respectively. Referring to FIG. 4A, each pixel 30 of the second electrode layer 3 is divided into a plurality of sub-pixels 303 each having an electrode pattern 31 corresponding to one of the monochromatic blocks 231, 232 and 233. Therefore, by arranging the electrode patterns 31 with different densities, the monochromatic blocks 231, 232 and 233 emit lights of different brightness so as to generate a full-color image. Further, referring to FIG. 4A, the first electrode layer 1 is an anode electrode layer and the second electrode layer 3 is a cathode electrode layer. In another example, referring to FIG. 4B, the first electrode layer 1 is a cathode electrode layer and the second electrode layer 3 is an anode electrode layer.

Figure 4B:
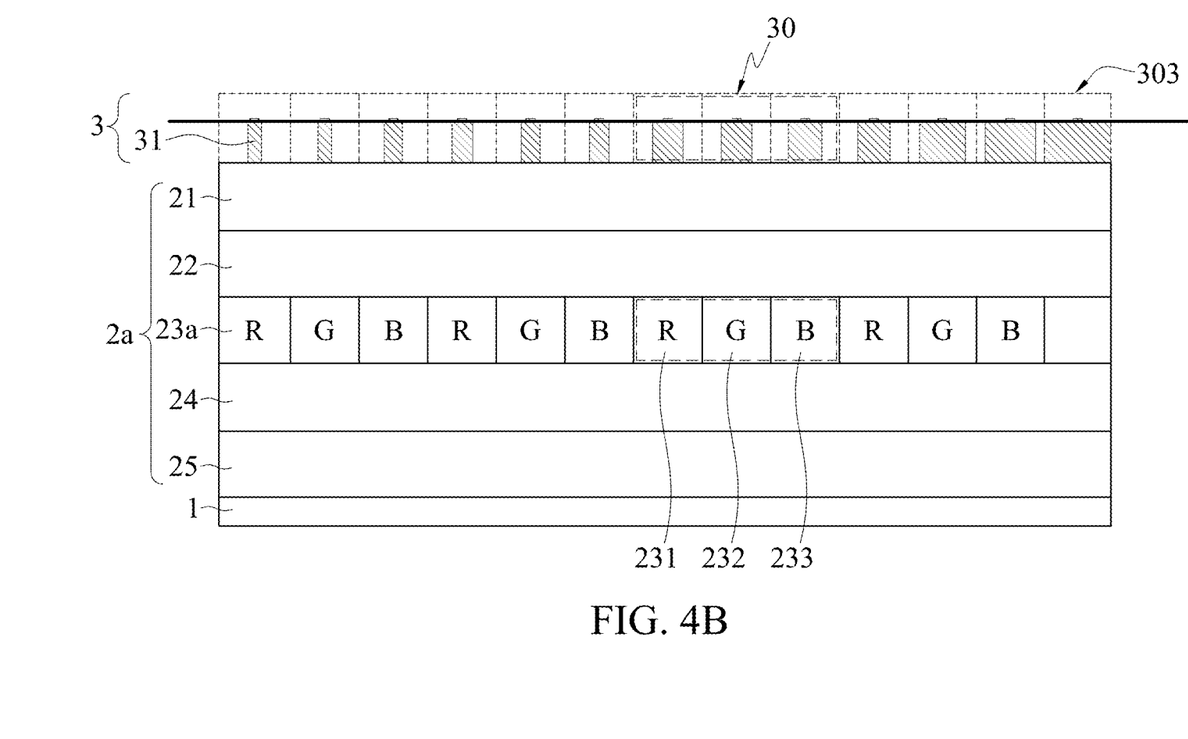
FIG. 4B is a schematic cross-sectional view showing another example of the light emitting device according to the fourth embodiment of the present disclosure.

Referring to FIGS. 4A and 4B, by arranging the electrode patterns 31 of the second electrode layer 3 with different densities, including changing the sizes or pitches of the electrode patterns or the number of the electrode patterns of each pixel, and causing each of the electrode patterns 31 of the second electrode layer 3 to correspond to one of the monochromatic blocks 231, 232 or 233 of the emitting layer 23a of the organic light emitting layer 2a, the light emitting device can be controlled to generate a full-color/grayscale image.

Figure 5A:
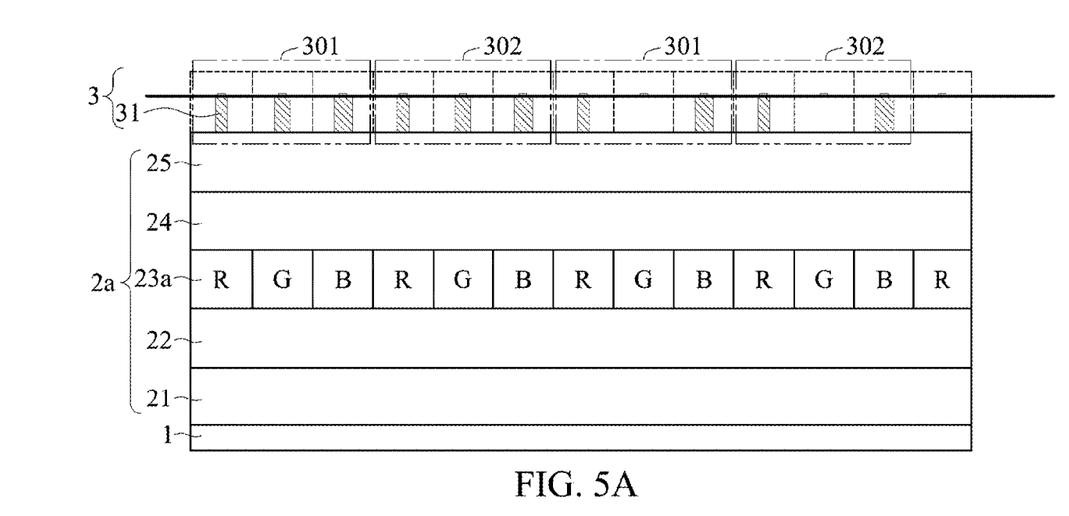
FIG. 5A is a schematic cross-sectional view of a light emitting device according to a fifth embodiment of the present disclosure.
Figure 5B:
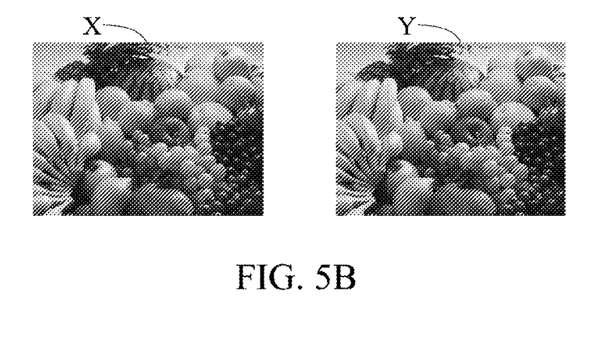
FIG. 5B shows images displayed by the light emitting device according to the fifth embodiment of the present disclosure.

FIG. 5A is a schematic cross-sectional view of a light emitting device according to a fifth embodiment of the present disclosure. In the fifth embodiment, the electrode patterns 31 of the second electrode layer 3 are divided into a plurality of electrode pattern groups. The electrode pattern groups are arranged in an alternate manner and display a same image. Referring to FIG. 5A, the electrode patterns 31 are divided into a first electrode pattern group 301 and a second electrode pattern group 302 that are arranged in an alternate manner. When a first voltage is applied between the first electrode layer 1 and the second electrode layer 3, the first electrode pattern group 301 displays an image X, and the second electrode pattern group 302 displays an image Y that is the same as the image X, as shown in FIG. 5B. As such, when a viewer views different images from different viewing angles of the right and left eyes, his brain combines the different images from both eyes into a three-dimensional image.

Figure 6A:
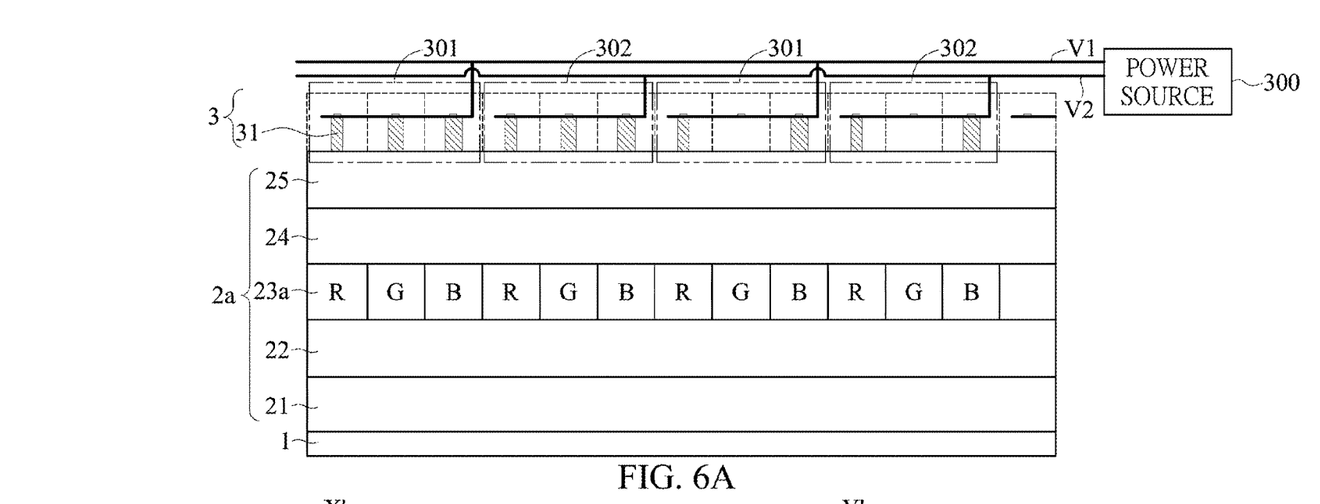
FIG. 6A is a schematic cross-sectional view of a light emitting device according to a sixth embodiment of the present disclosure.
Figure 6B:
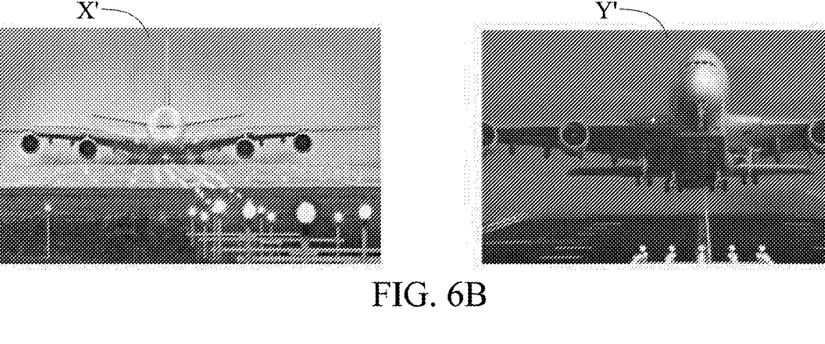
FIG. 6B shows images displayed by the light emitting device according to the sixth embodiment of the present disclosure.

FIG. 6A is a schematic cross-sectional view of a light emitting device according to a sixth embodiment of the present disclosure, and FIG. 6B shows images displayed by the light emitting device according to the sixth embodiment of the present disclosure. The sixth embodiment differs from the fifth embodiment in that the electrode pattern groups of the light emitting device of the sixth embodiment display different images and a same or different voltages are applied to the electrode pattern groups at different times. Referring to FIG. 6A, a power source 300 supplies a first voltage V1 and a second voltage V2 to the first electrode pattern group 301 and the second electrode pattern group 302, respectively, at different times. In particular, referring to FIG. 6B, at a first time, the first voltage V1 is switched on and the second voltage V2 is switched off such that the first electrode pattern group 301 displays an image X'. At a second time, the first voltage V1 is switched off and the second voltage V2 is switched on such that the second electrode pattern group 302 shows an image Y'. As such, the light emitting device generates a dynamic image.

Further, the first voltage V1 or the second voltage V2 and the image can have a parallel type regular image circuit configuration, a parallel type irregular image circuit configuration, a series type regular image circuit configuration or a series type irregular image circuit configuration.

In the fifth and sixth embodiments, the electrode patterns 31 of the second electrode layer 3 have different sizes or pitches. The emitting layer 23a of the organic light emitting layer 2a is subjected to a color separation process to form a plurality of monochromatic blocks that correspond to the electrode patterns 31 of the second electrode layer 3, respectively.

Figure 5C:
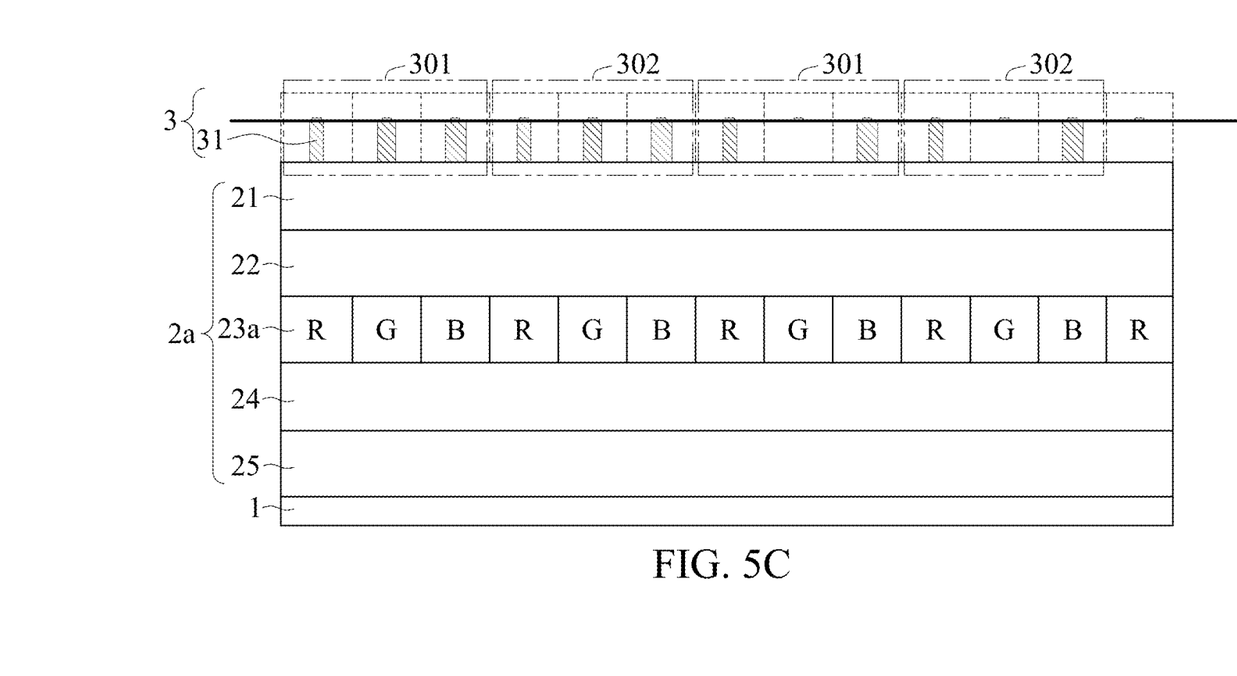
FIG. 5C is a schematic cross-sectional view showing another example of the light emitting device according to the fifth embodiment of the present disclosure.
Figure 6C:
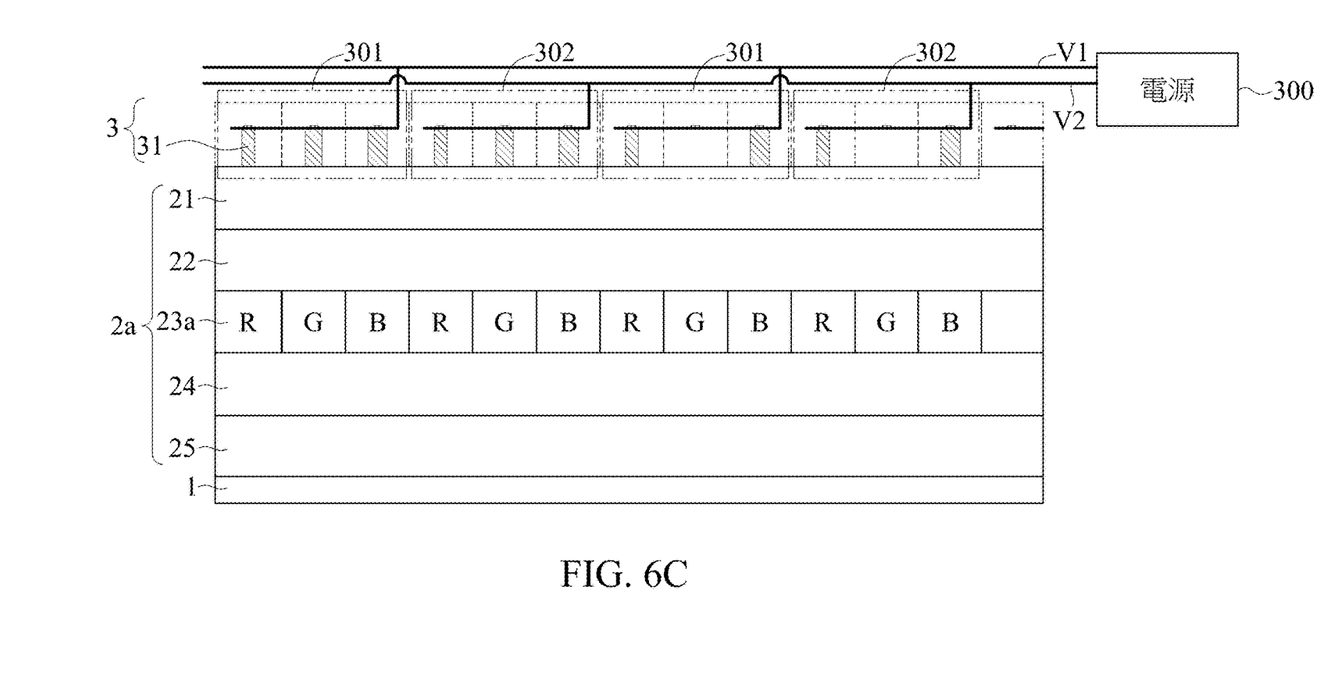
FIG. 6C is a schematic cross-sectional view showing another example of the light emitting device according to the sixth embodiment of the present disclosure.

In FIGS. 5A and 6A, the first electrode layer 1 is an anode electrode layer, and the second electrode layer 3 is a cathode electrode layer. In another example, as shown in FIGS. 5C and 6C, the first electrode layer 1 is a cathode electrode layer, and the second electrode layer 3 is an anode electrode layer.

Figure 7A:
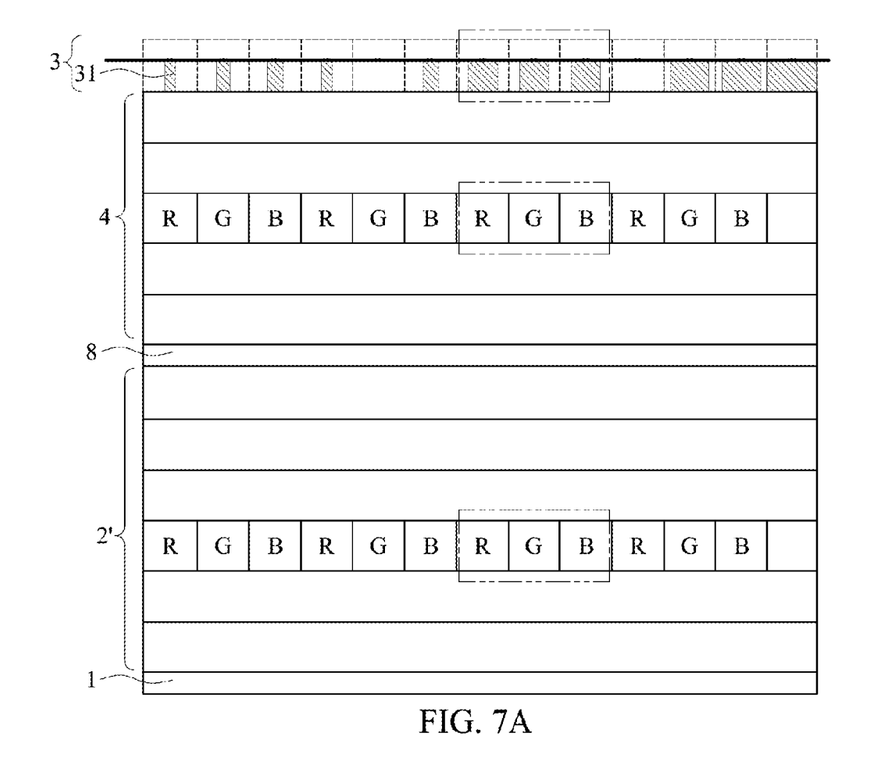
FIG. 7A is a schematic cross-sectional view of a light emitting device according to a seventh embodiment of the present disclosure.
Figure 7B:
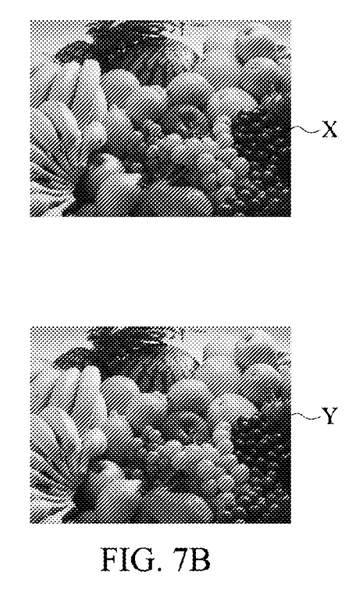
FIG. 7B shows images displayed by the light emitting device according to the seventh embodiment of the present disclosure.

FIG. 7A is a schematic cross-sectional view of a light emitting device according to a seventh embodiment of the present disclosure, and FIG. 7B shows images displayed by the light emitting device according to the seventh embodiment of the present disclosure. Referring to FIG. 7A, the light emitting device of the seventh embodiment has a first electrode layer 4, a first organic light emitting layer 2', an electric charge generating layer 8, a second organic light emitting layer 4 and a second electrode layer 3 sequentially stacked on one another. The second electrode layer 3 is patterned to form a plurality of electrode patterns 31 arranged with different densities. For example, the electrode patterns 31 have different sizes or pitches, or each pixel has a different number of the electrode patterns 31. In an example, the first electrode layer 1 is an anode electrode layer, and the second electrode layer 3 is a cathode electrode layer. In another example, the first electrode layer 1 is a cathode electrode layer, and the second electrode layer 3 is an anode electrode layer.

When a voltage is applied between the first electrode layer 1 and the second electrode layer 3, since both the first and second organic light emitting layers 2' and 4 correspond to the same patterned electrode layer 3, the light emitting device generates two identical images X, Y in a vertical direction, as shown in FIG. 7B. When the two images are viewed at different distances from a viewer, the two images have differences in brightness and color. As such, the two images are combined to generate a three-dimensional image.

Figure 8A:
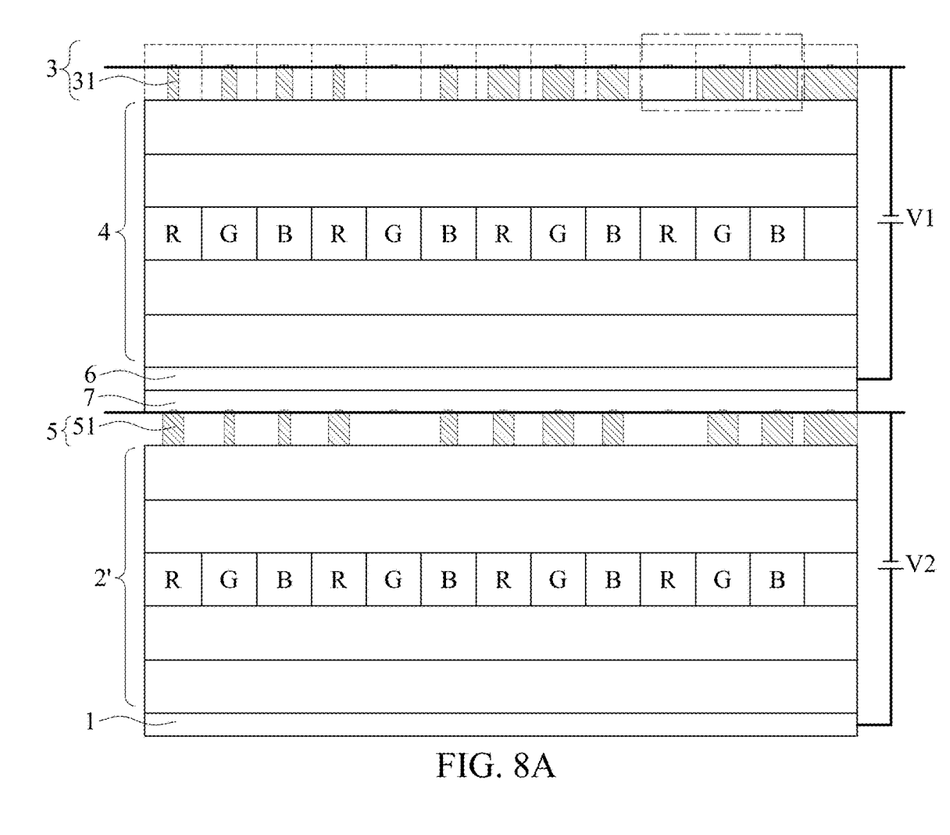
FIG. 8A is a schematic cross-sectional view of a light emitting device according to an eighth embodiment of the present disclosure.
Figure 8B:
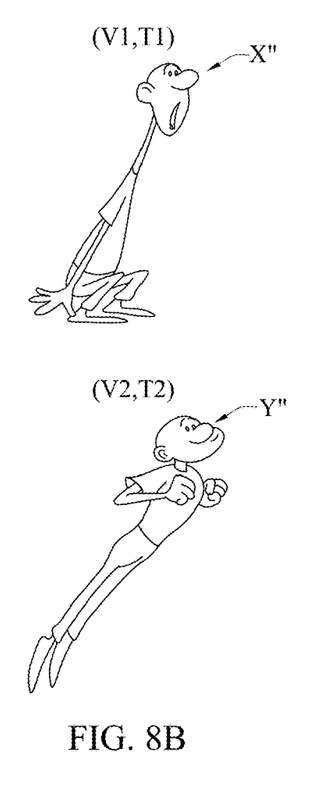
FIG. 8B shows images displayed by the light emitting device according to the eighth embodiment of the present disclosure.

FIG. 8A is a schematic cross-sectional view of a light emitting device according to an eighth embodiment of the present disclosure, and FIG. 8B shows images displayed by the light emitting device according to the eighth embodiment of the present disclosure. The light emitting device of the eighth embodiment further has a third electrode layer 5, an insulating layer 7 and a fourth electrode layer 6 sequentially stacked between the first organic light emitting layer 2' and the second organic light emitting layer 4. In an example, the first electrode layer 1 and the fourth electrode layer 6 are anode electrode layers, and the second electrode layer 3 and the third electrode layer 5 are cathode electrode layers. In another example, the first electrode layer 1 and the fourth electrode layer 6 are cathode electrode layers, and the second electrode layer 3 and the third electrode layer 5 are anode electrode layers Referring to FIG. 8A, the third electrode layer 5 is patterned to form a plurality of electrode patterns 51 arranged with different densities. For example, the electrode patterns 51 have different sizes or pitches, or each pixel has a different number of the electrode patterns 51. The electrode patterns 51 of the third electrode layer 5 display an image Y", and the electrode patterns 31 of the second electrode layer 3 display an image X". Further, a same or different voltages are applied to the third electrode layer 5 and the second electrode layer 3 at different times.

At a first time T1, a first voltage V1 is applied between the second electrode layer 3 and the fourth electrode layer 6, and at a second time T2, a second voltage V2 is applied between the third electrode layer 5 and the first electrode layer 1, thus generating a dynamic image, as shown in FIG. 8B.

In the seventh and eighth embodiments, the electrode patterns 31 of the second electrode layer 3 have different sizes or pitches, and the electrode patterns 51 of the third electrode layer 5 have different sizes or pitches. The first organic light emitting layer 2' and the second organic light emitting layer 4 are subjected to a color separation process to form a plurality of monochromatic blocks. The electrode patterns 31 of the second electrode layer 3 and the electrode patterns 51 of the third electrode layer 5 correspond to the monochromatic blocks.

According to the present disclosure, the second electrode layer, which is a cathode electrode layer or an anode electrode layer, is patterned to form a plurality of electrode patterns arranged with different densities. As such, when a voltage is applied between the first electrode layer and the second electrode layer, the light emitting device of the present disclosure generates a grayscale image, thereby eliminating the need to control each pixel through a thin film transistor as in the prior art. Further, the organic light emitting layer can be subjected to a color separation process to form a plurality of R, G and B monochromatic blocks. Since the electrode patterns have different sizes or pitches, the light emitting device can generate a full-color/grayscale image. Furthermore, by arranging the electrode patterns in a vertical direction or a horizontal direction and applying voltages of suitable values and time sequences on the electrode layers, the light emitting device of the present disclosure can generate a three-dimensional or dynamic image.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A light emitting device, comprising:
   a first electrode layer;
   an organic light emitting layer formed on the first electrode layer; and
   a second electrode layer formed on the organic light emitting layer,
   wherein the organic light emitting layer is sandwiched between the first electrode layer and the second electrode layer, the second electrode layer includes a plurality of electrode patterns separated from one another, the electrode patterns of the second electrode correspond to a plurality of monochromatic blocks and have different sizes or numbers to form different density, and the electrode patterns are divided into a plurality of electrode pattern groups that are arranged in an alternate manner, wherein each of the electrode patterns is free from being connected to a thin film transistor (TFT) and a chiplet.

2. The light emitting device of claim 1, wherein the electrode patterns have different pitches.

3. The light emitting device of claim 1, wherein the first electrode layer is an anode electrode layer, and the second electrode layer is a cathode electrode layer.

4. The light emitting device of claim 1, wherein the first electrode layer is a cathode electrode layer, and the second electrode layer is an anode electrode layer.

5. The light emitting device of claim 1, wherein the electrode pattern groups display a same image, and a same voltage is applied to the electrode pattern groups at a same time.

6. The light emitting device of claim 1, wherein the electrode pattern groups display different images, and a same or different voltages are applied to the electrode pattern groups at different times.

7. The light emitting device of claim 1, wherein the organic light emitting layer is subjected to a color separation process to form a plurality of monochromatic blocks that correspond to the electrode patterns, respectively.

* * * * *